US011616207B2

(12) United States Patent
Zhang et al.

(10) Patent No.: US 11,616,207 B2
(45) Date of Patent: Mar. 28, 2023

(54) ORGANIC-LIGHT-EMITTING-DIODE DEVICE AND FABRICATING METHOD THEREOF, DISPLAYING BASE PLATE AND DISPLAYING DEVICE

(71) Applicants: Chengdu BOE Optoelectronics Technology Co., Ltd., Sichuan (CN); BOE Technology Group Co., Ltd., Beijing (CN)

(72) Inventors: Wei Zhang, Beijing (CN); Chao Kong, Beijing (CN); Yifan Yang, Beijing (CN); Long Chen, Beijing (CN); Lingjun Dai, Beijing (CN); De Yuan, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 114 days.

(21) Appl. No.: 17/330,829

(22) Filed: May 26, 2021

(65) Prior Publication Data
US 2022/0029119 A1 Jan. 27, 2022

(30) Foreign Application Priority Data
Jul. 21, 2020 (CN) .......................... 202010706825.0

(51) Int. Cl.
*H10K 50/11* (2023.01)
*H10K 59/12* (2023.01)
(Continued)

(52) U.S. Cl.
CPC ...... *H01L 51/5004* (2013.01); *H01L 27/3244* (2013.01); *H01L 51/001* (2013.01);
(Continued)

(58) Field of Classification Search
None
See application file for complete search history.

(56) References Cited

U.S. PATENT DOCUMENTS

| 2007/0009762 A1 | 1/2007 | Hamada et al. |
| 2013/0015424 A1 | 1/2013 | Chung et al. |

(Continued)

FOREIGN PATENT DOCUMENTS

| CN | 1893748 A | 1/2007 |
| CN | 104701354 A * | 6/2015 |

(Continued)

OTHER PUBLICATIONS

Machine translation of CN-104701354 (Year: 2015).*
(Continued)

*Primary Examiner* — J. E. Schoenholtz
(74) *Attorney, Agent, or Firm* — WHDA, LLP

(57) ABSTRACT

An organic-light-emitting-diode device and a fabricating method thereof, a displaying base plate and a displaying device, wherein the organic-light-emitting-diode device includes a substrate, and an anode layer, an organic functional layer and a cathode layer that are provided in stacking on one side of the substrate, wherein the organic functional layer includes a first functional layer, a second functional layer and a light emitting layer that are provided in stacking, and the first functional layer is provided closer to the anode layer; and a HOMO energy level of the second functional layer is deeper than both of a HOMO energy level of the first functional layer and a HOMO energy level of a host material of the light emitting layer.

14 Claims, 4 Drawing Sheets

(51) Int. Cl.
  *H10K 77/10* (2023.01)
  *H10K 50/852* (2023.01)
  *H10K 71/16* (2023.01)
  *H10K 71/00* (2023.01)
  *H10K 102/00* (2023.01)
  *H10K 101/30* (2023.01)
  *H01L 51/50* (2006.01)
  *H01L 27/32* (2006.01)
  *H01L 51/00* (2006.01)
  *H01L 51/52* (2006.01)
  *H01L 51/56* (2006.01)

(52) U.S. Cl.
  CPC ...... *H01L 51/0011* (2013.01); *H01L 51/0097* (2013.01); *H01L 51/5265* (2013.01); *H01L 51/56* (2013.01); *H01L 2227/323* (2013.01); *H01L 2251/5338* (2013.01); *H01L 2251/552* (2013.01); *H01L 2251/558* (2013.01)

(56) References Cited

U.S. PATENT DOCUMENTS

| | | |
|---|---|---|
| 2014/0054556 A1 | 2/2014 | Park et al. |
| 2015/0144895 A1 | 5/2015 | Joo et al. |
| 2015/0295197 A1* | 10/2015 | Adamovich ........ H01L 51/5024 257/40 |
| 2016/0380035 A1* | 12/2016 | Cho .................... H01L 51/5088 257/40 |
| 2018/0122870 A1 | 5/2018 | Park et al. |
| 2018/0151631 A1* | 5/2018 | Lee ....................... H01L 27/322 |
| 2020/0127212 A1* | 4/2020 | Adamovich ........ H01L 51/0085 |
| 2020/0168830 A1* | 5/2020 | Kishimoto .......... H01L 51/5008 |
| 2021/0193946 A1 | 6/2021 | Zhang et al. |
| 2021/0367178 A1* | 11/2021 | Moon ................. H01L 51/5064 |

FOREIGN PATENT DOCUMENTS

| | | |
|---|---|---|
| CN | 105514292 A | 4/2016 |
| CN | 108023022 A | 5/2018 |
| CN | 108023023 A | 5/2018 |
| CN | 108461641 A | 8/2018 |
| CN | 108666435 A | 10/2018 |
| CN | 110364636 A | 10/2019 |
| CN | 110993678 A | 4/2020 |
| WO | 2013180540 A1 | 12/2013 |

OTHER PUBLICATIONS

Office Action dated Nov. 15, 2022, issued in counterpart CN application No. 202010706825.0, with English machine translation. (22 pages).

* cited by examiner

Prior Art

ORGANIC-LIGHT-EMITTING-DIODE DEVICE AND FABRICATING METHOD THEREOF, DISPLAYING BASE PLATE AND DISPLAYING DEVICE

CROSS REFERENCE TO RELEVANT APPLICATIONS

The present disclosure claims the priority of the Chinese patent application filed on Jul. 21, 2020 before the Chinese Patent Office with the application number of 202010706825.0 and the title of "ORGANIC-LIGHT-EMITTING-DIODE DEVICE AND FABRICATING METHOD THEREOF, DISPLAYING BASE PLATE AND DISPLAYING DEVICE", which is incorporated herein in its entirety by reference.

TECHNICAL FIELD

The present disclosure relates to the technical field of displaying, and particularly relates to an organic-light-emitting-diode device and a fabricating method thereof, a displaying base plate and a displaying device.

BACKGROUND

As compared with liquid-crystal screens, Organic Light-Emitting Diode (OLED) screens have the advantages such as a good bendability and a high contrast, and increasingly more panel manufacturers have started to pay attention to or invest in this field. As shown in FIG. 1, the principle of the light emitting of OLED screens is that: Holes are injected from the anode, electrons are injected from the cathode, and the electrons and the holes recombine in the light emitting layer and thus emit light. Therefore, the brightness of OLED screens is controlled by using the magnitude of the electric current that passes through the pixels of the OLED device.

SUMMARY

The present disclosure provides an organic-light-emitting-diode device and a fabricating method thereof, a displaying base plate and a displaying device.

In order to solve the above problems, the present disclosure provides an organic-light-emitting-diode device, wherein the organic-light-emitting-diode device comprises:

a substrate, and an anode layer, an organic functional layer and a cathode layer that are provided in stacking on one side of the substrate, wherein the organic functional layer comprises a first functional layer, a second functional layer and a light emitting layer that are provided in stacking, and the first functional layer is provided closer to the anode layer; and a HOMO energy level of the second functional layer is deeper than both of a HOMO energy level of the first functional layer and a HOMO energy level of a host material of the light emitting layer.

Optionally, a difference between the HOMO energy level of the second functional layer and the HOMO energy level of the host material of the light emitting layer is greater than or equal to 0.4 eV.

Optionally, the first functional layer is a hole transporting layer, and a difference between the HOMO energy level of the second functional layer and the HOMO energy level of the hole transporting layer is greater than or equal to 0.4 eV.

Optionally, the first functional layer is a microcavity regulating layer, and the organic functional layer further comprises a hole transporting layer provided on a side of the microcavity regulating layer that is further away from the light emitting layer.

Optionally, a difference between the HOMO energy level of the second functional layer and the HOMO energy level of the microcavity regulating layer is greater than or equal to 0.4 eV.

Optionally, a thickness of the second functional layer is greater than or equal to 5 nm.

Optionally, the organic functional layer further comprises a hole blocking layer and an electron transporting layer that are provided in stacking on a side of the light emitting layer that is further away from the first functional layer, and the hole blocking layer is provided closer to the light emitting layer.

In order to solve the above problems, the present disclosure further discloses a displaying base plate, wherein the displaying base plate comprises a plurality of pixel units, each of the pixel units comprises a first sub-pixel unit, and the first sub-pixel unit comprises the organic-light-emitting-diode device according to any one of the above embodiments.

Optionally, the first sub-pixel unit is a red-light sub-pixel unit.

Optionally, each of the pixel units further comprises a blue-light sub-pixel unit, and a material of the second functional layer comprises: one or more of an electron-blocking-layer material of the blue-light sub-pixel unit, a hole-blocking-layer material of the blue-light sub-pixel unit and an electron-transporting-layer material of the blue-light sub-pixel unit.

Optionally, the first sub-pixel unit is a blue-light sub-pixel unit or a green-light sub-pixel unit.

In order to solve the above problems, the present disclosure further discloses a displaying device, wherein the displaying device comprises the displaying base plate according to any one of the above embodiments.

Optionally, the displaying device is for two-dimensional displaying or three-dimensional displaying of a target to be displayed.

In order to solve the above problems, the present disclosure further discloses a fabricating method of the organic-light-emitting-diode device stated above, wherein the fabricating method comprises:

providing the substrate; and forming sequentially the anode layer, the organic functional layer and the cathode layer on one side of the substrate.

Optionally, the step of forming sequentially the anode layer, the organic functional layer and the cathode layer on one side of the substrate comprises:

forming the anode layer on the one side of the substrate;

forming the organic functional layer by vapor deposition on a side of the anode layer that is further away from the substrate; and forming the cathode layer on a side of the organic functional layer that is further away from the substrate.

Optionally, the first functional layer is a microcavity regulating layer, the organic functional layer further comprises a hole transporting layer, and the step of forming the organic functional layer by vapor deposition on the side of the anode layer that is further away from the substrate comprises:

by using a common metal mask, forming the hole transporting layer by vapor deposition on the side of the anode layer that is further away from the substrate; and by using a fine metal mask, forming sequentially by vapor deposition the microcavity regulating layer, the second functional layer and the light emitting layer on a side of the hole transporting layer that is further away from the substrate.

Optionally, the organic functional layer further comprises a hole blocking layer and an electron transporting layer, and after the step of, by using the fine metal mask, forming sequentially by vapor deposition the microcavity regulating layer, the second functional layer and the light emitting layer on the side of the hole transporting layer that is further away from the substrate, the method further comprises:

by using the common metal mask, forming sequentially by vapor deposition the hole blocking layer and the electron transporting layer on a side of the light emitting layer that is further away from the substrate.

Optionally, the substrate comprises a glass base plate or a flexible substrate, and a driving circuit formed on the glass base plate or the flexible substrate.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

DETAILED DESCRIPTION

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Because the brightness of an OLED device is decided by the magnitude of the electric current of the OLED device, the controlling on the electric current by the driving thin-film transistor (DTFT) directly influences the luminous intensity of the OLED screen. Because the resolutions of OLED screens are becoming increasingly higher and the light emitting region of a pixel is becoming increasingly smaller, when the brightness of a screen is maintained constant, the electric current of each of the pixels becomes increasingly smaller, especially the electric current at an extremely low grayscale. If the electric current is smaller, it is more difficult to accurately control the driving thin-film transistor. Therefore, various mura imperfections happen in OLED screens at a low grayscale. In addition, when the screen is at a 0 grayscale, because the driving thin-film transistor has a very slight electric leakage, when the current density caused by the electric leakage exceeds the minimum current density required for lightening the OLED device, it lightens the device, to cause the screen to have a very slight brightness even when operating at a 0 grayscale, which reduces the contrast of the screen.

Figure 1:
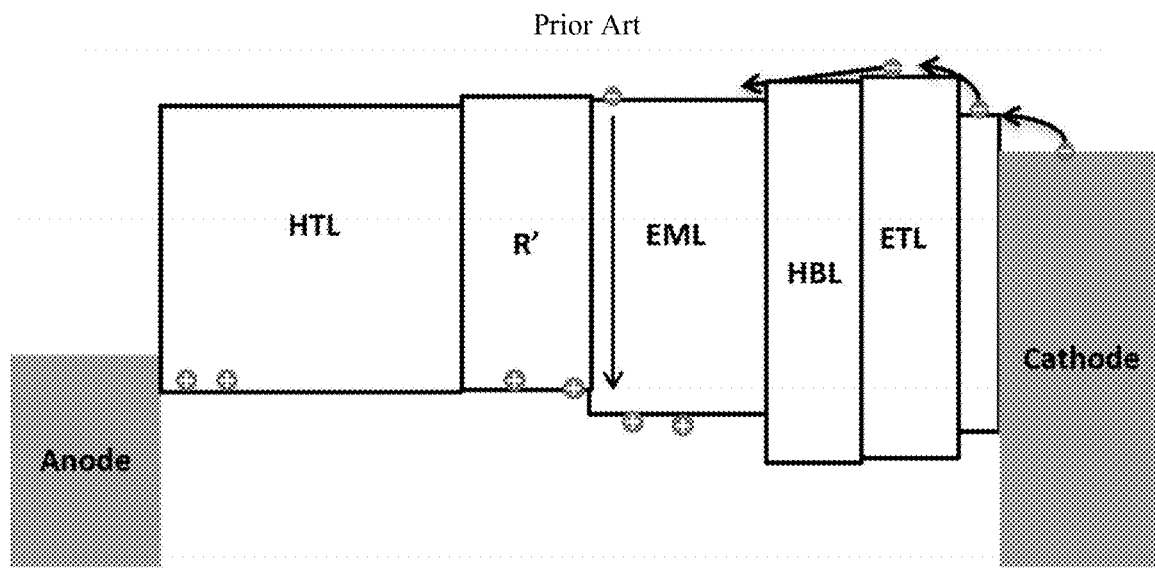
FIG. 1 shows the structure of an organic-light-emitting-diode device in the related art.
Figure 2:
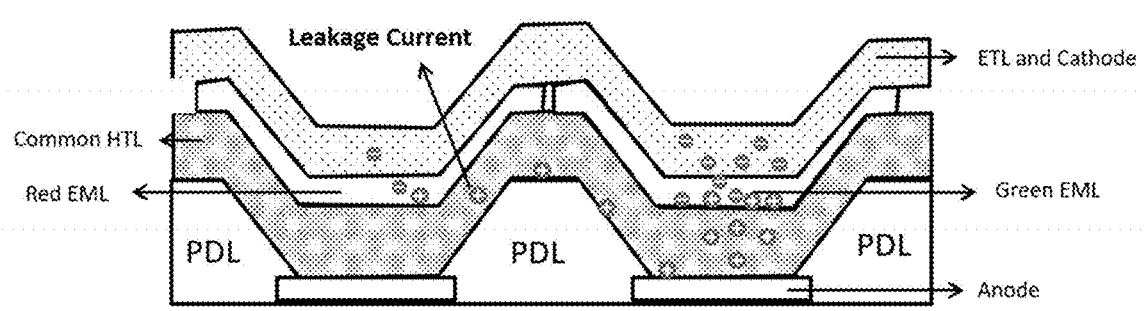
FIG. 2 shows a schematic structural diagram of the electric leakage of a common HTL of an organic-light-emitting-diode device.

In addition, as a result of the fabrication, the hole transporting layers (HTL) of the pixels of the color channels in the RGB color mode are connected together, as shown in FIG. 2. In order to reduce the operating voltage of the OLED device, the thin layer where the HTLs and the anode Anode contact is doped, thereby increasing the injection of the holes. After doped, the thin layer has a better electric conductivity. Taking FIG. 2 as an example, when the green-light pixel (Green EML) is lightened, a small quantity of the holes flow into the red-light pixel (Red EML) via the Common HTL layer, thereby generating a leakage current, to slightly lighten the red-light pixel. Therefore, at a low grayscale, a monochromatic light always lightens the surrounding pixels of other colors, thereby causing the color gamut of the panel at a low grayscale to become smaller, and making white frames at a low grayscale reddish.

Figure 3:
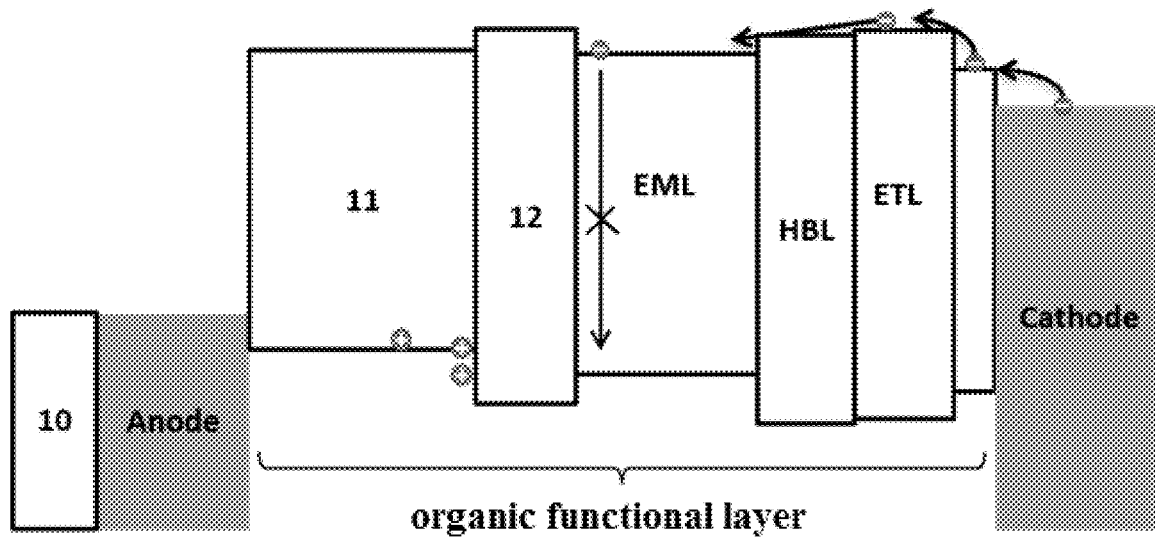
FIG. 3 shows a schematic structural diagram of the organic-light-emitting-diode device according to an embodiment of the present disclosure.

In order to eliminate the mura imperfections at a low grayscale, and the imperfections in the image quality such as the shrinking of the color gamut caused by interference, an embodiment of the present disclosure provides an organic-light-emitting-diode device. Referring to FIG. 3, the organic-light-emitting-diode device may comprise: a substrate 10, and an anode layer Anode, an organic functional layer and a cathode layer Cathode that are provided in stacking on one side of the substrate 10, the organic functional layer comprises a first functional layer 11, a second functional layer 12 and a light emitting layer EML that are provided in stacking, and the first functional layer 11 is provided closer to the anode layer Anode.

The Highest Occupied Molecular Orbital (HOMO) energy level of the second functional layer 12 is deeper than both of the HOMO energy level of the first functional layer 11 and the HOMO energy level of the host material of the light emitting layer EML. In other words, the HOMO energy level of the second functional layer 12 is deeper than the HOMO energy level of the first functional layer 11, and the HOMO energy level of the second functional layer 12 is also deeper than the HOMO energy level of the host material of the light emitting layer EML.

In practical applications, referring to FIG. 3, the organic functional layer may further comprise a hole blocking layer HBL and an electron transporting layer ETL that are provided in stacking on the side of the light emitting layer EML that is further away from the first functional layer 11, and the hole blocking layer HBL is provided closer to the light emitting layer EML.

Because the HOMO energy level of the second functional layer 12 is deeper than the HOMO energy levels of both of the host material of the light emitting layer EML and the first functional layer 11, a hole blocking barrier potential is formed at the interface between the first functional layer 11 and the second functional layer 12, and the hole blocking barrier potential can block a certain quantity of holes at the interface. At a low current density, referring to FIG. 3, because of the potential barrier, most of the holes are blocked at the interface between the first functional layer 11 and the second functional layer 12, and the light emitting layer EML has merely electrons and nearly has holes, and cannot provide excitonic luminescence. At this point, the luminous efficiency of the organic-light-emitting-diode device is extremely low, and therefore the organic-light-emitting-diode device has an extremely low brightness at the extremely low electric current, which can increase the operating-current density of the organic-light-emitting-diode device at a certain brightness.

Because of the effect of the second functional layer 12 of blocking holes, the OLED has a low luminous efficiency at a low current density, which in turn increases the operating current of the OLED at a low grayscale and a low brightness, thereby facilitating the driving thin-film transistor to more accurately control the extremely low electric current, to prevent the problem of an abnormal image quality at a low grayscale and a low brightness. In addition, at and around the turn-off current of the driving thin-film transistor, the brightness of the OLED is extremely low, which facilitates to reduce the mura imperfections partially caused by the leakage current of the BP backplane, increases the contrast of the screen, and improves the image quality of the OLED screen.

At a low grayscale, the common hole transporting layer or microcavity regulating layer generates a slight hole leakage current. However, because the second functional layer 12 blocks a major of the hole leakage current, and merely a small part of the hole leakage current can pass, when a green-light pixel is lightened, even if a neighboring red-light pixel can be lightened, its brightness is much weaker than that of a red-light pixel in a conventional structure, thereby increasing the color purity and the color gamut of a monochromatic frame at a low grayscale, inhibiting various problems of imperfections caused by lightening of a red-light pixel by electric leakage at low grayscale, reducing the affection on the image quality by the leakage current caused by the common hole transporting layer, and effectively reducing the problem of interference at a low grayscale caused by the electric leakage of the common hole transporting layer.

The present embodiment, by providing the second functional layer 12 having a deeper the HOMO energy level in the organic-light-emitting-diode device, has a simple structure, is easily implementable, and increases the contrast of the screen via the design of the OLED device; increases the operating current in the low-brightness mode, and improves the image quality of the frames at an extremely low grayscale; and can further inhibit the problem of electric leakage caused by the common hole transporting layer, to solve the imperfections of interference of the image quality of the OLED screen.

Optionally, when the light emitting layer EML of the organic-light-emitting-diode device emits red light, the material of the second functional layer 12 may be, for example, the electron-blocking-layer material of the blue-light device, the hole-blocking-layer material of the blue-light device or the electron-transporting-layer material of the blue-light device. When the material of the second functional layer 12 is the electron-blocking-layer material of the blue-light device, it cannot only block the holes from entering the light emitting layer EML, but can also block the electrons from entering the second functional layer 12 to recombine with the holes, which can more effectively reduce the luminous efficiency at an extremely low current density. It should be noted that all of the materials whose HOMO energy level is deeper than the HOMO energy levels of both of the first functional layer 11 and the host material of the light emitting layer EML may be used as the material of the second functional layer 12, and the particular material is not limited in the present embodiment.

In order to prevent the affection by the tunneling effect, the thickness of the second functional layer 12 may be greater than or equal to 5 nm.

Taking into consideration the hole transporting property, in order to effectively block the holes at a low current density, optionally, the difference between the HOMO energy level of the second functional layer 12 and the HOMO energy level of the host material of the light emitting layer EML may be greater than or equal to 0.4 eV.

Figure 4:
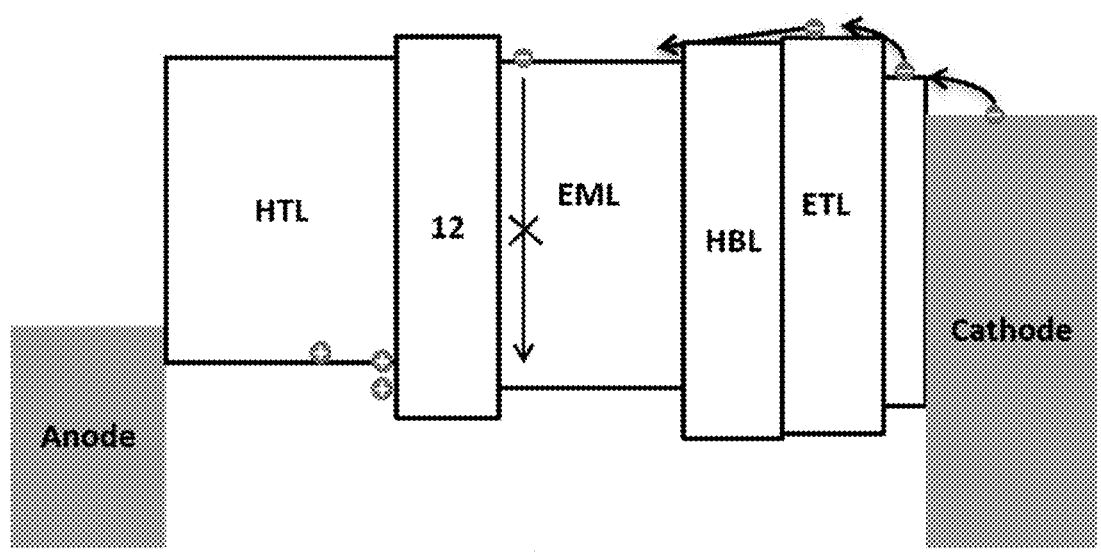
FIG. 4 shows a schematic structural diagram of the organic-light-emitting-diode device according to an embodiment of the present disclosure, when the first functional layer is a hole transporting layer.

Optionally, referring to FIG. 4, the first functional layer 11 may be a hole transporting layer HTL, and the difference between the HOMO energy level of the second functional layer 12 and the HOMO energy level of the hole transporting layer HTL may be greater than or equal to 0.4 eV.

Figure 5:
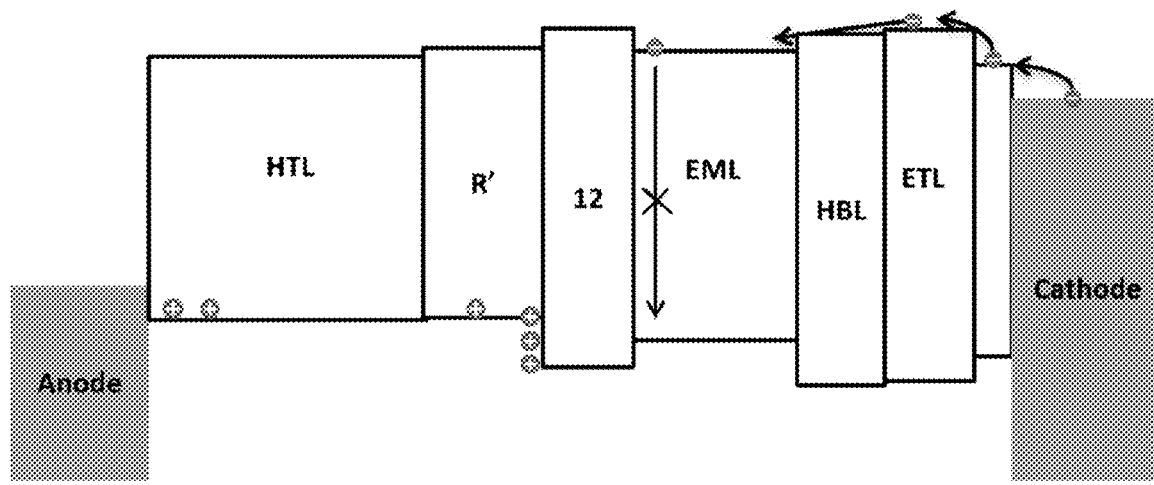
FIG. 5 shows a schematic structural diagram of the organic-light-emitting-diode device according to an embodiment of the present disclosure, when the first functional layer is a microcavity regulating layer and the device is at an extremely low electric current.

Optionally, referring to FIG. 5, the first functional layer 11 may be a microcavity regulating layer R', and the organic functional layer may further comprise a hole transporting layer HTL that is provided on the side of the microcavity regulating layer R' that is further away from the light emitting layer EML. The difference between the HOMO energy level of the second functional layer 12 and the HOMO energy level of the microcavity regulating layer R' may be greater than or equal to 0.4 eV.

Figure 6:
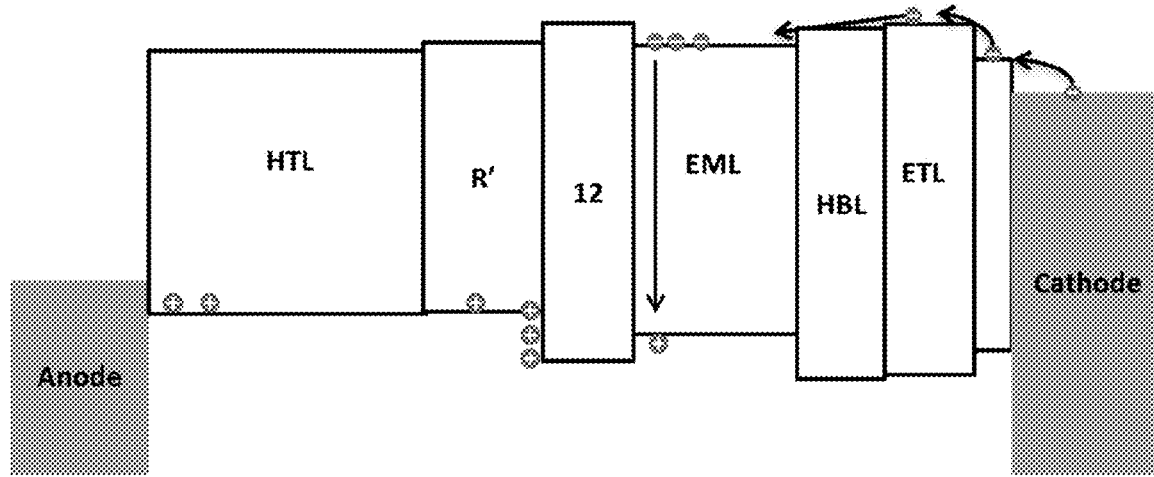
FIG. 6 shows a schematic structural diagram of the organic-light-emitting-diode device according to an embodiment of the present disclosure, when the first functional layer is a microcavity regulating layer and the electric current is starting to increase.
Figure 7:
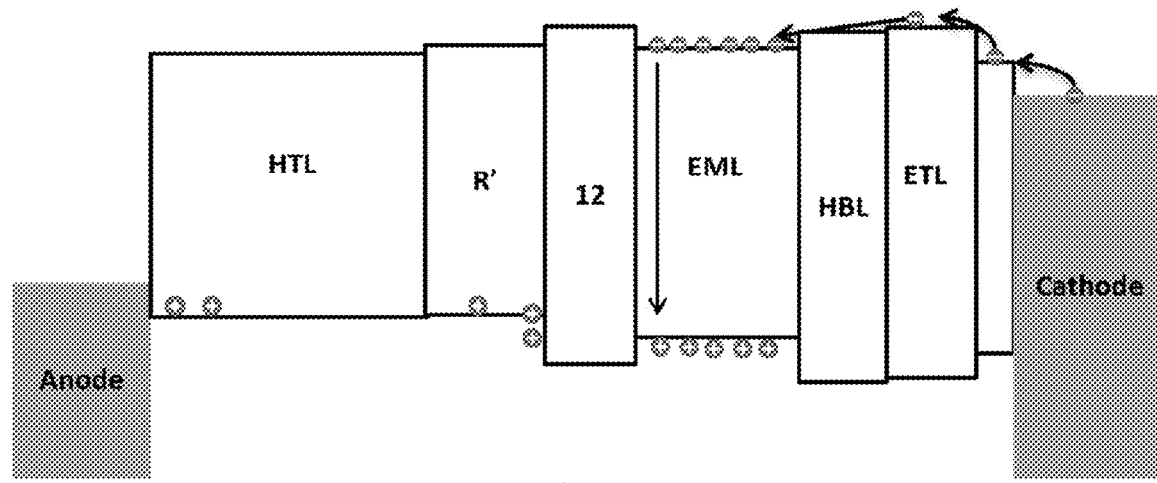
FIG. 7 shows a schematic structural diagram of the organic-light-emitting-diode device according to an embodiment of the present disclosure, when the first functional layer is a microcavity regulating layer and the electric current is large.

Referring to FIG. 5, because the HOMO energy level of the second functional layer 12 is deeper than the HOMO energy levels of both of the host material of the light emitting layer EML and the microcavity regulating layer R', a hole blocking barrier potential is formed at the interface between the microcavity regulating layer R' and the second functional layer 12, and the hole blocking barrier potential can block a certain quantity of holes at the interface. At a low current density, referring to FIG. 5, because of the potential barrier, most of the holes are blocked at the interface between the microcavity regulating layer R' and the second functional layer 12, and the light emitting layer EML has merely electrons and nearly has holes, which results in a very low luminous efficiency. When the operating-current density is increasingly increased, referring to FIG. 6, the voltage exerted on the film layer of the second functional layer 12 is increasingly higher, and a large quantity of holes continuously climb over the barrier potential to reach the light emitting layer EML, and, in the light emitting layer EML, combine with the electrons to form excitons to in turn perform recombination luminescence. When the current density is increasingly higher, referring to FIG. 7, the proportion of the holes blocked by the second functional layer 12 in all of the holes is increasingly smaller, and, at this point, the luminous efficiency of the device is increasingly approaching the luminous efficiency of normal devices, as shown in FIG. 8.

Figure 8:
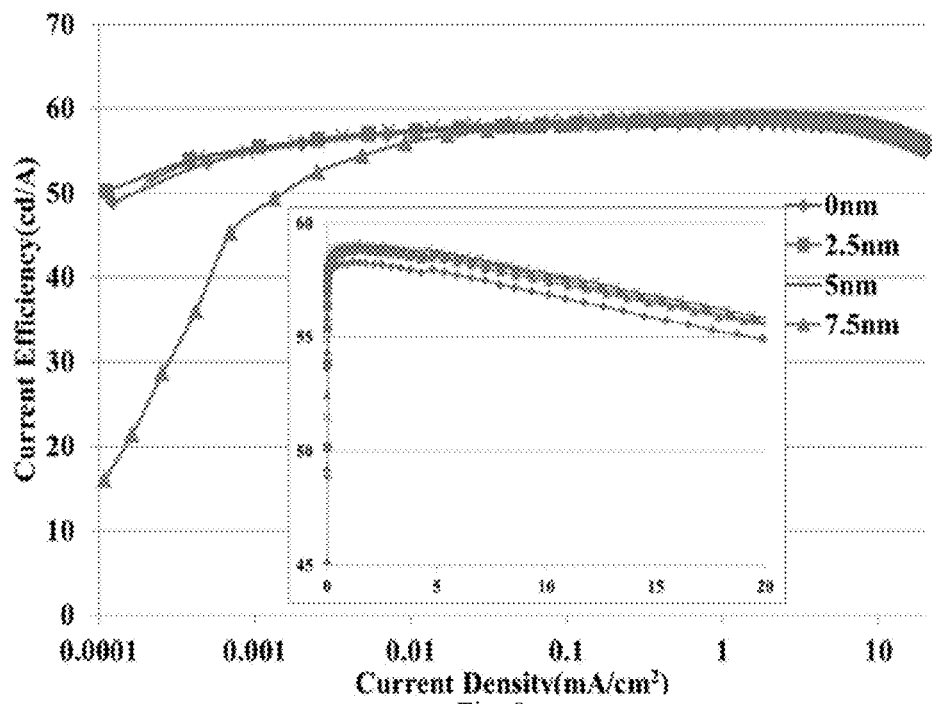
FIG. 8 shows relations between the luminous efficiencies and the current densities of the organic-light-emitting-diode devices having the second functional layers of different thicknesses according to an embodiment of the present disclosure.

Referring to FIG. 8, FIG. 8 shows the rule of the changing of the electric-current luminous efficiency over the current density of the organic-light-emitting-diode devices having the second functional layers of different thicknesses. When the thickness of the second functional layer 12 reaches 7.5 nm, the luminous efficiency of the organic-light-emitting-diode device at an extremely low current density (just lightened) is far less than the luminous efficiencies of those of the other thicknesses. When the operating-current density is being increased, the luminous efficiency of the organic-light-emitting-diode device quickly increases. When the operating-current density has exceeded 0.1 mA/cm$^2$, the luminous efficiency of the organic-light-emitting-diode device is not different from the luminous efficiencies of common devices.

Figure 9:
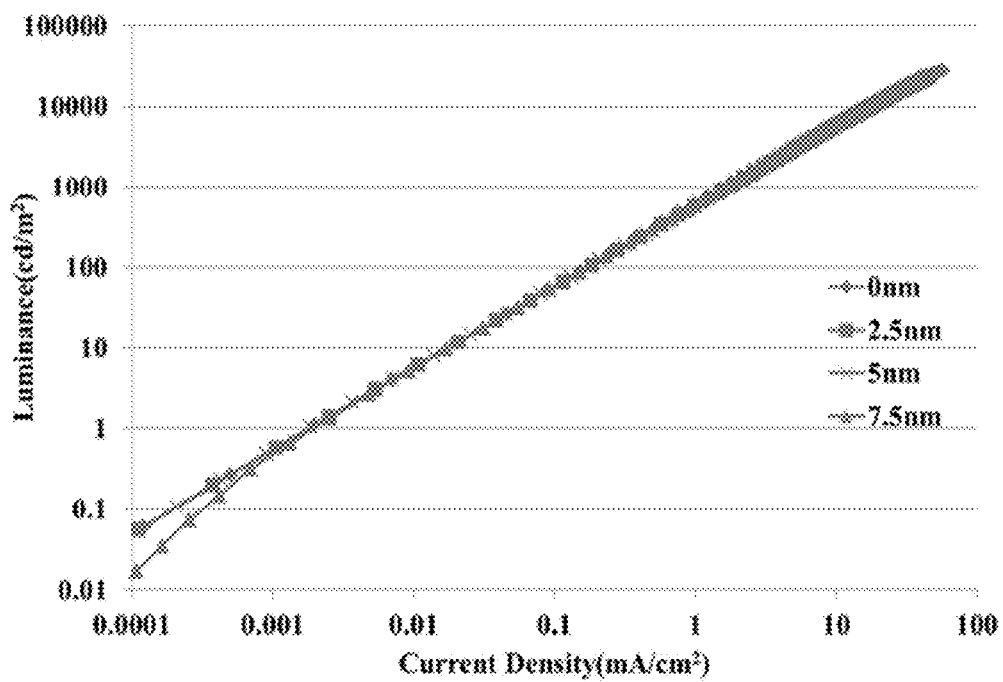
FIG. 9 shows relations between the brightnesses and the current densities of the organic-light-emitting-diode devices having the second functional layers of different thicknesses according to an embodiment of the present disclosure.

FIG. 9 is curves of the changing of the brightness of the organic-light-emitting-diode device over the operating current. At an extremely low current density, when the thicknesses of the second functional layer 12 is 7.5 nm, the organic-light-emitting-diode device requires a higher operating current to reach a certain brightness.

Therefore, the organic-light-emitting-diode device according to the present embodiment increases the operating-current density at a low brightness, which can improve the image quality of the frames of the OLED at an extremely low grayscale and an extremely low brightness, and moreover can reduce the affection on the image quality by a leakage current. In addition, the organic-light-emitting-diode device according to the present embodiment has a low luminous efficiency at a low grayscale, but has a normal luminous efficiency at a high grayscale, so the power consumption of the device at a high brightness is not influenced.

Another embodiment of the present disclosure further provides a displaying base plate, wherein the displaying base plate comprises a plurality of pixel units, each of the pixel units comprises a first sub-pixel unit, and the first sub-pixel unit comprises the organic-light-emitting-diode device according to any one of the above embodiments.

In practical applications, the red-light sub-pixels are highly affected by a leakage current or an interference current. Therefore, in order to effectively improve the image quality of the frames of the display panel at an extremely low grayscale and an extremely low brightness, and reduce the affection on the image quality by a leakage current, the first sub-pixel unit may be a red-light sub-pixel unit.

In practical applications, the first sub-pixel unit may also be a blue-light sub-pixel unit or a green-light sub-pixel unit and so on.

The pixel units may also comprise a blue-light sub-pixel unit, and the material of the second functional layer of the organic-light-emitting-diode device having the red-light sub-pixel unit may include: one or more of an electron-blocking-layer material of the blue-light sub-pixel unit, a hole-blocking-layer material of the blue-light sub-pixel unit and an electron-transporting-layer material of the blue-light sub-pixel unit. Accordingly, the fabricating process does not require to re-arrange the existing vapor deposition source, which reduces the difficulty in the fabrication.

When the material of the second functional layer of the organic-light-emitting-diode device having the red-light sub-pixel unit is the electron-blocking-layer material of the blue-light device, it cannot only block the holes from entering the light emitting layer EML, but can also block the electrons from entering the second functional layer to recombine with the holes, which can more effectively reduce the luminous efficiency at an extremely low current density.

Another embodiment of the present disclosure further provides a displaying device, wherein the displaying device comprises the displaying base plate according to any one of the above embodiments.

It should be noted that the displaying device according to the present embodiment may be a display panel, an electronic paper, a mobile phone, a smart watch, a tablet personal computer, a TV set, a notebook computer, a digital photo frame, a navigator and any other products or components that have the function of 2D or 3D displaying.

Figure 10:
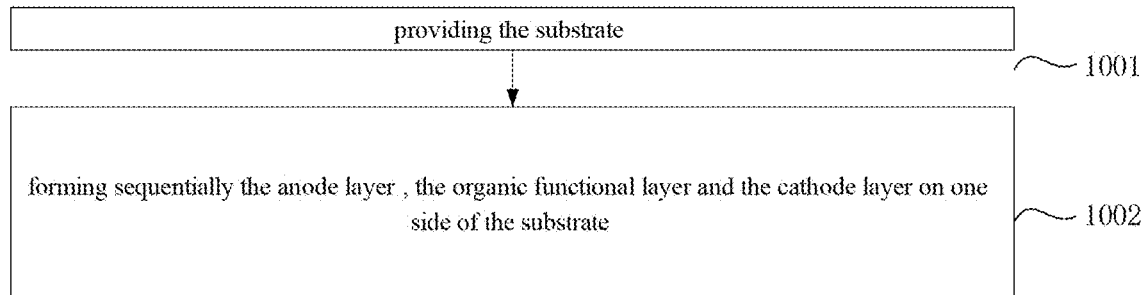
FIG. 10 shows a flow chart of the steps of the fabricating method of the organic-light-emitting-diode device according to an embodiment of the present disclosure.

Another embodiment of the present disclosure further provides a fabricating method of the organic-light-emitting-diode device stated above. Referring to FIG. 10, the fabricating method may comprise:

Step 1001: providing the substrate.

The substrate may comprise a glass base plate or a flexible substrate, and components such as a driving circuit formed on the glass base plate or the flexible substrate.

Step 1002: forming sequentially the anode layer, the organic functional layer and the cathode layer on one side of the substrate.

Figure 11:
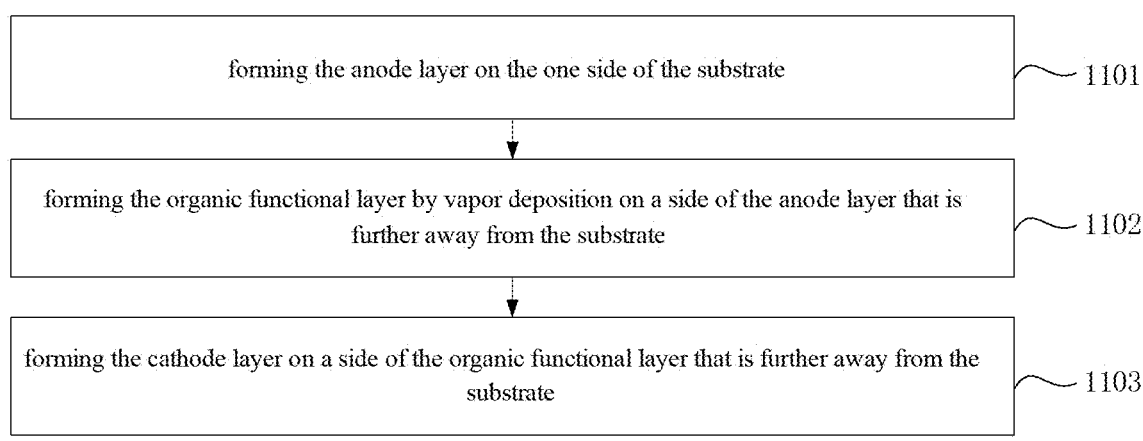
FIG. 11 shows a flow chart of the steps of the particular fabricating method of the organic-light-emitting-diode device according to an embodiment of the present disclosure.

Optionally, referring to FIG. 11, the step 1002 may particularly comprise:

Step 1101: forming the anode layer on the one side of the substrate.

Step 1102: forming the organic functional layer by vapor deposition on a side of the anode layer that is further away from the substrate.

When the first functional layer is a microcavity regulating layer and the organic functional layer further comprises a hole transporting layer, this step may particularly comprise: by using a common metal mask, forming the hole transporting layer by vapor deposition on the side of the anode layer that is further away from the substrate; and by using a fine metal mask, forming sequentially by vapor deposition the microcavity regulating layer, the second functional layer and the light emitting layer on a side of the hole transporting layer that is further away from the substrate.

When the organic functional layer further comprises a hole blocking layer and an electron transporting layer, this step may further comprise: by using a common metal mask, forming sequentially by vapor deposition the hole blocking layer and the electron transporting layer on a side of the light emitting layer that is further away from the substrate.

The common metal mask (CMM) is used for the vapor deposition of the common layers of all of the sub-pixel units (for example, the red-light sub-pixel unit, the green-light sub-pixel unit and the blue-light sub-pixel unit). The fine metal mask (FMM) is used for the vapor deposition of the film layers of the sub-pixel units of different colors (for example, the red-light sub-pixel unit, the green-light sub-pixel unit and the blue-light sub-pixel unit).

In a particular implementation, this step may comprise firstly vapor-depositing the hole transporting layers of the R/G/B sub-pixel units on the anode layer by using the common metal mask; then vapor-depositing the microcavity regulating layers, the second functional layers and the light emitting layers of the R/G/B sub-pixel units on the hole transporting layer by using the fine metal mask; and then vapor-depositing the hole blocking layer and the electron transporting layer on the light emitting layer by using the common metal mask, to obtain the organic functional layer.

Step 1103: forming the cathode layer on a side of the organic functional layer that is further away from the substrate.

By using the fabricating method according to the present embodiment, the organic-light-emitting-diode device according to any one of the above embodiments can be fabricated, as shown in FIGS. 3 to 5.

The present embodiment provides an organic-light-emitting-diode device and a fabricating method thereof, a displaying base plate and a displaying device, wherein the organic-light-emitting-diode device comprises a substrate, and an anode layer, an organic functional layer and a cathode layer that are provided in stacking on one side of the substrate, wherein the organic functional layer comprises a first functional layer, a second functional layer and a light emitting layer that are provided in stacking, and the first functional layer is provided closer to the anode layer; and a HOMO energy level of the second functional layer is deeper than both of a HOMO energy level of the first functional layer and a HOMO energy level of a host material of the light emitting layer. In the technical solutions of the present disclosure, by providing the material of the second functional layer having the deeper HOMO energy level, a hole blocking barrier potential is formed at the interface between the first functional layer 11 and the second functional layer 12. Therefore, at an extremely low current density, the holes are blocked by the barrier potential, and are very difficult to enter the light emitting layer and combine with the electrons to emit light, and therefore the organic-light-emitting-diode device has an extremely low brightness at the extremely low electric current, which can increase the operating-current density of the organic-light-emitting-diode device at a low brightness. The solutions of the present disclosure can improve the image quality of the frames of the OLED at an extremely low grayscale and an extremely low brightness, and moreover can reduce the affection on the image quality by a leakage current, to overcome the problem of interference between the pixels.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The organic-light-emitting-diode device and the fabricating method thereof, the displaying base plate and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. An organic-light-emitting-diode device, wherein the organic-light-emitting-diode device comprises:
   a substrate, and an anode layer, an organic functional layer and a cathode layer that are provided in stacking on one side of the substrate, wherein the organic functional layer comprises a first functional layer, a second functional layer and a light emitting layer that are provided in stacking, and the first functional layer is provided closer to the anode layer; and
   a HOMO energy level of the second functional layer is deeper than both of a HOMO energy level of the first functional layer and a HOMO energy level of a host material of the light emitting layer,
   wherein the first functional layer is a microcavity regulating layer, and the organic functional layer further comprises a hole transporting layer provided on a side of the microcavity regulating layer that is further away from the light emitting layer.

2. The organic-light-emitting-diode device according to claim 1, wherein a difference between the HOMO energy level of the second functional layer and the HOMO energy level of the host material of the light emitting layer is equal to 0.4 eV.

3. The organic-light-emitting-diode device according to claim 1, wherein a difference between the HOMO energy level of the second functional layer and the HOMO energy level of the microcavity regulating layer is equal to 0.4 eV.

4. The organic-light-emitting-diode device according to claim 1, wherein a thickness of the second functional layer is in a range of 5 nm to 7.5 nm.

5. The organic-light-emitting-diode device according to claim 1, wherein the organic functional layer further comprises a hole blocking layer and an electron transporting layer that are provided in stacking on a side of the light emitting layer that is further away from the first functional layer, and the hole blocking layer is provided closer to the light emitting layer.

6. The organic-light-emitting-diode device according to claim 1, wherein the substrate comprises a glass base plate or a flexible substrate, and a driving circuit formed on the glass base plate or the flexible substrate.

7. A displaying base plate, wherein the displaying base plate comprises a plurality of pixel units, each of the pixel units comprises a first sub-pixel unit, and the first sub-pixel unit comprises the organic-light-emitting-diode device according to claim 1.

8. The displaying base plate according to claim 7, wherein the first sub-pixel unit is a red-light sub-pixel unit.

9. The displaying base plate according to claim 8, wherein each of the pixel units further comprises a blue-light sub-pixel unit, and a material of the second functional layer comprises: one or more of an electron-blocking-layer material of the blue-light sub-pixel unit, a hole-blocking-layer material of the blue-light sub-pixel unit and an electron-transporting-layer material of the blue-light sub-pixel unit.

10. The displaying base plate according to claim 7, wherein the first sub-pixel unit is a blue-light sub-pixel unit or a green-light sub-pixel unit.

11. A displaying device, wherein the displaying device comprises the displaying base plate according to claim 7.

12. The displaying device according to claim 11, wherein the displaying device is for two-dimensional displaying or three-dimensional displaying of a target to be displayed.

13. A fabricating method of an organic-light-emitting-diode device, wherein the fabricating method comprises:
  providing a substrate; and
  forming sequentially an anode layer, an organic functional layer and a cathode layer on one side of the substrate, wherein the organic functional layer comprises a first functional layer, a second functional layer and a light emitting layer that are provided in stacking, and the first functional layer is provided closer to the anode layer, and a HOMO energy level of the second functional layer is deeper than both of a HOMO energy level of the first functional layer and a HOMO energy level of a host material of the light emitting layer;
  wherein the step of forming sequentially the anode layer, the organic functional layer and the cathode layer on one side of the substrate comprises:
    forming the anode layer on the one side of the substrate;
    forming the organic functional layer by vapor deposition on a side of the anode layer that is further away from the substrate; and
    forming the cathode layer on a side of the organic functional layer that is further away from the substrate;
  wherein the first functional layer is a microcavity regulating layer, the organic functional layer further comprises a hole transporting layer, and the step of forming the organic functional layer by vapor deposition on the side of the anode layer that is further away from the substrate comprises:
    by using a common metal mask, forming the hole transporting layer by vapor deposition on the side of the anode layer that is further away from the substrate; and
    by using a fine metal mask, forming sequentially by vapor deposition the microcavity regulating layer, the second functional layer and the light emitting layer on a side of the hole transporting layer that is further away from the substrate.

14. The fabricating method according to claim 13, wherein the organic functional layer further comprises a hole blocking layer and an electron transporting layer, and after the step of, by using the fine metal mask, forming sequentially by vapor deposition the microcavity regulating layer, the second functional layer and the light emitting layer on the side of the hole transporting layer that is further away from the substrate, the method further comprises:
  by using the common metal mask, forming sequentially by vapor deposition the hole blocking layer and the electron transporting layer on a side of the light emitting layer that is further away from the substrate.

* * * * *